United States Patent [19]
Maeda et al.

[11] Patent Number: 5,904,568
[45] Date of Patent: May 18, 1999

[54] METHOD OF MANUFACTURING A SEMICONDUCTOR WAFER

[75] Inventors: Masahiko Maeda; Takamitsu Harada; Hisami Motoura; Eiichi Asano, all of Kanagawa, Japan

[73] Assignee: Komatsu Electronic Metals Co., Ltd., Kanagawa, Japan

[21] Appl. No.: 08/941,294

[22] Filed: Sep. 30, 1997

[30] Foreign Application Priority Data

Oct. 4, 1996 [JP] Japan ................................ 8-299202

[51] Int. Cl.⁶ ........................... H01L 21/00; H01L 21/02
[52] U.S. Cl. .......................... 438/690; 438/691; 438/692
[58] Field of Search ................... 438/690, 691, 438/692

[56] References Cited

U.S. PATENT DOCUMENTS

| | | | |
|---|---|---|---|
| 4,885,056 | 12/1989 | Hall et al. | 438/691 |
| 5,395,788 | 3/1995 | Abe et al. | 438/690 |
| 5,429,711 | 7/1995 | Watanabe et al. | 438/692 |
| 5,712,198 | 1/1998 | Shive et al. | 134/2 |
| 5,756,399 | 5/1998 | Hajime et al. | 438/692 |
| 5,800,725 | 9/1998 | Kato et al. | 438/692 |

OTHER PUBLICATIONS

Metals Handbook American Society for Metals pp. 35–2 and 35–25, 1985.

*Primary Examiner*—Charles Bowers
*Assistant Examiner*—David S. Blum
*Attorney, Agent, or Firm*—Sughrue, Mion, Zinn, Macpeak & Seas, PLLC

[57] ABSTRACT

A process for precisely and efficiently manufacturing a semiconductor wafer is provided, which can prevent contamination by metals inside silicon crystals and remove the factors that degrade the GOI produced during the wafer manufacturing steps. A sliced and chamfered semiconductor wafer is subjected to lapping. The lapped semiconductor wafer is then etched, and thus the working strains produced by lapping is removed. The two sides of the etched semiconductor wafer are then primary polished with a dual-surface polishing machine. The primary polished semiconductor wafer is etched with an aqueous solution of 1% NaOH solution. The weak alkali etched semiconductor wafer is then mirror processed by a finish polishing. The finish polished semiconductor wafer is washed with an SC-1 solution.

7 Claims, 3 Drawing Sheets

METHOD OF MANUFACTURING A SEMICONDUCTOR WAFER

BACKGROUND OF THE INVENTION

1. Field of the Invention

The present invention relates to a method of manufacturing a semiconductor wafer having a high gate oxide film insulation (hereinafter referred as GOI: Gate Oxide film Insulation). In particular, it relates to a manufacturing process for semiconductor wafers, which can obtain a yield exceeding 60% when measuring the GOI and is performed by removing the factors that degrade the GOI produced in the manufacturing process of semiconductor wafers.

2. Description of the Prior Art

Conventionally, among the factors that degrade GOI, the factors that occur on the surfaces of semiconductor wafers during the manufacturing process from cutting of semiconductor ingots to mirror finish of the surface of semiconductor wafer, are removed by further processing. An example of this process is the sacrificial oxidation method. The method involves forming an oxidation film on the surface of semiconductor wafer by heat treatment, removing the oxidation film by etching and then washing.

However, in the heat treatment for forming the oxidation film, if there are metal contaminants, the metal contaminants diffuse into the inside of silicon crystals (hereinafter referred as contamination), and become defects of the silicon crystal per se.

Moreover, besides it takes time for the sacrificial oxidation treatment, the method is performed after the mirror processing, and thus once contamination exists, all the manufacturing steps before this step become void. Accordingly, the sacrificial oxidation method is not reliable and is inefficient.

SUMMARY OF THE INVENTION

In view of the above problems, an object of the invention is to provide a process which can prevent contamination by metals inside the silicon crystal and precisely and efficiently manufacture semiconductor wafers free of the factors that degrade the GOI.

In order to attain the object, the process for manufacturing semiconductor wafers includes primary polishing at least one surface of a semiconductor wafer, etching the primary polished semiconductor wafer with a weak alkali etching solution, mirror processing the surface of the weak alkali etched wafer by a finish polishing (mirror polishing), and washing the finish polished wafer with a washing solution having a weak etching characteristic.

By adding a weak alkali etching step between the primary polishing step and the finish polishing step, which are both conventional manufacturing steps of semiconductor wafers, the working strains caused by primary polishing on the surface of semiconductor wafers can be removed. And in the finish polishing, by using a polishing slurry containing grains having a grain size less than 5 nm to perform fine polishing and a slurry having a pH of 10–11 to increase the chemical action of the polishing and finally washing the surface of the semiconductor wafers with an SC-1 solution to remove the slight working strain layer produced by the finish polishing, smoother mirror-polished semiconductor wafers are obtained. In this way, the GOI can be improved exceedingly.

Moreover, according to the method of the invention, compared with the conventional manufacturing process, in fact the only alkali etching step is increased. The etched thickness by the alkali etching is in the range of 20–1,000 nm, and thus compared with the sacrificial oxidation method, the processing time is exceedingly reduced.

Moreover, it is not limited to adding an alkali etching step after the primary polishing, as described above. In the later step than the middle step of the primary polishing, replacing a normal slurry with an alkali solution containing no grinding grains can also obtain the same effect.

Moreover, according to the above sacrificial oxidation method, once metal contaminants exist in the silicon crystal of the semiconductor wafers, which have been subjected to normal treatment, before the sacrificial oxidation treatment, the manufacturing steps prior to that time become void. In this respect, in accordance with the manufacturing method of the invention, because the contaminants occurred in the heat treatment to form the oxide film can be avoided, the manufacturing steps prior to the final step will not become void and the manufacturing can be conducted precisely and efficiently.

BRIEF DESCRIPTION OF THE DRAWINGS

The present invention is described hereinafter by reference to the examples and the drawings, in which.

DETAILED DESCRIPTION OF THE INVENTION

Example

Figure 1:
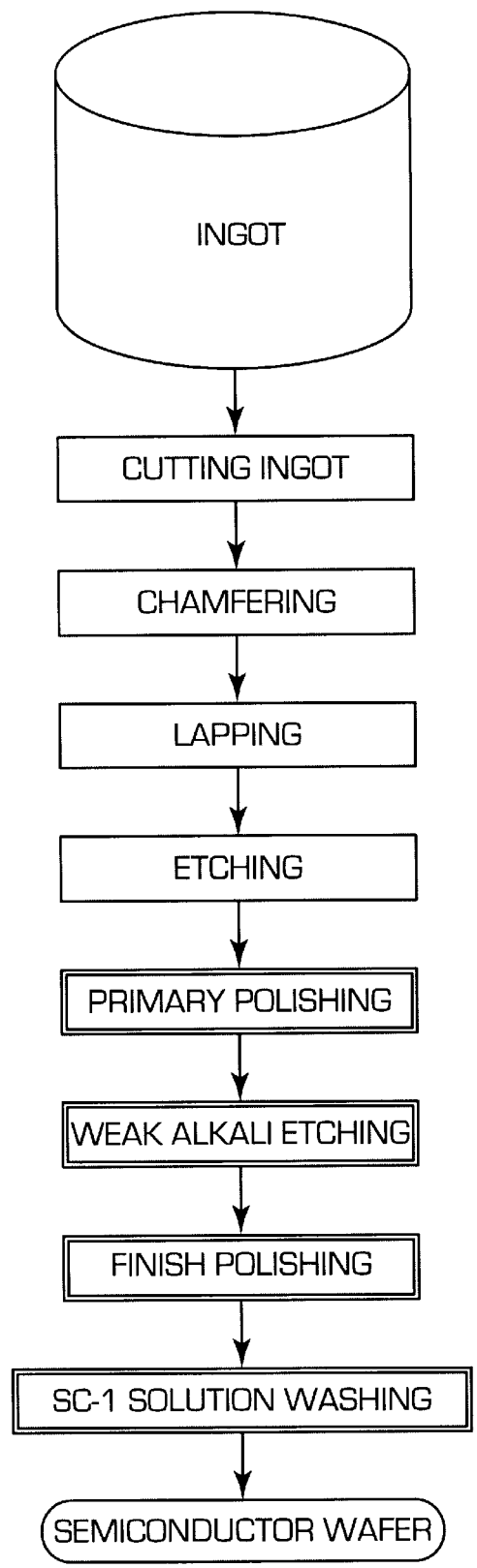
FIG. 1 is a flow chart showing the manufacturing process of the Example.

The manufacturing process of this example, as shown in FIG. 1, includes the following steps:

(1) lapping the sliced and chamfered semiconductor wafer.
(2) etching the lapped semiconductor wafer and removing the working strains produced by lapping.
(3) primary polishing the two sides of an etched semiconductor wafer using a dual-surface primary polishing machine.
(4) etching the primary polished semiconductor wafer with an aqueous solution containing 1% NaOH.
(5) mirror processing the weak alkali etched semiconductor wafer by a finish polishing.
(6) washing the finish polished semiconductor wafer with an SC-1 solution.

Figure 2A:
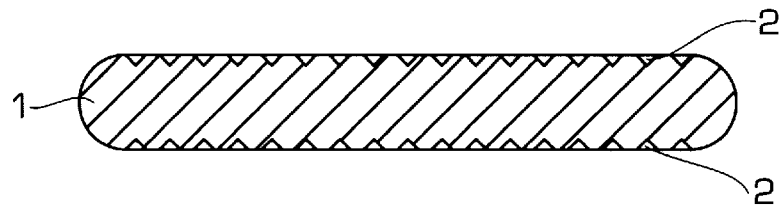
FIGS. 2(a)–2(d) are section views of the semiconductor wafers in each manufacturing step according to the Example.

The primary polishing of the example involves simultaneously primary polishing the two sides of a semiconductor wafer by using a dual-surface polishing machine. The semiconductor wafer after the primary polishing, as shown in FIG. 2(a), is roughly planar. Working strains 2 were produced on the surface and reverse surface of the primary polished semiconductor wafer 1 by the primary polishing.

Figure 2B:
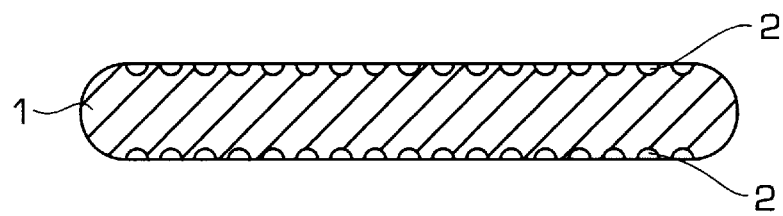

In the weak alkali etching step, an aqueous solution of 1% NaOH was used, and the etching thickness was controlled to be 500 nm. As a result, as shown in FIG. 2(b), same of the working strains 2 produced in the primary polishing step was removed.

Figure 3:
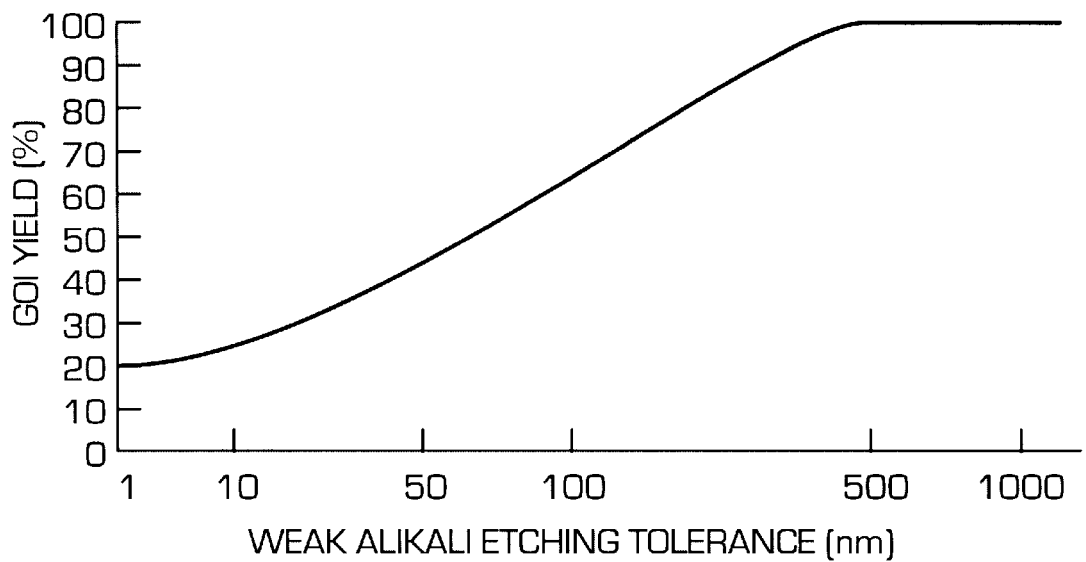
FIG. 3 is a graph showing the change of yield measured by the GOI of a semiconductor wafer which is weak alkali etched after the primary polishing.
Figure 4:
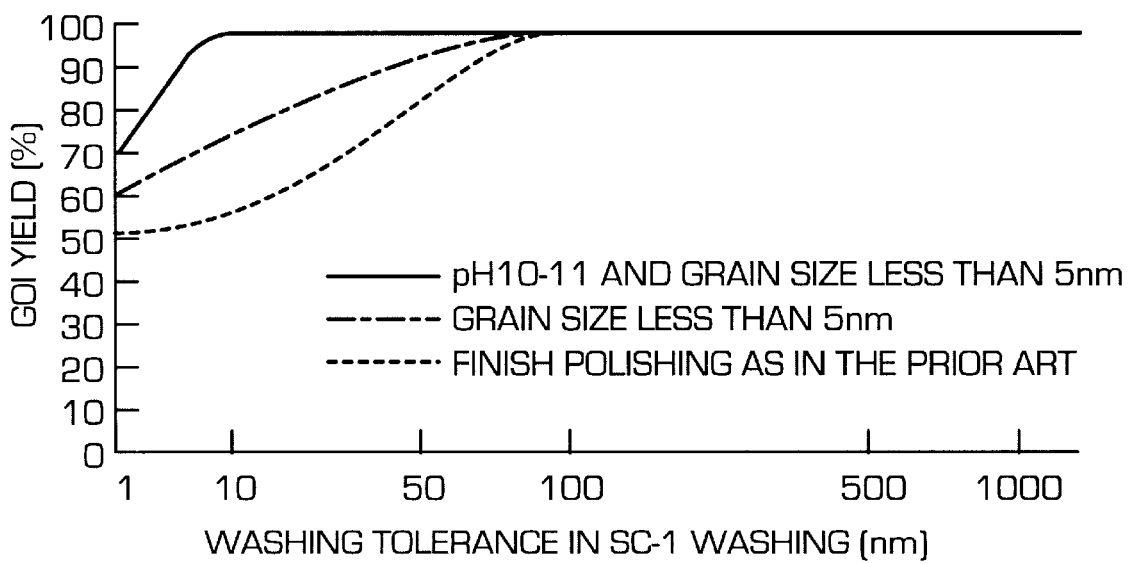
FIG. 4 is a graph showing the yield measured by the GOI of a semiconductor wafer which is subjected to finish polishing under different conditions followed by washing with an SC-1 solution.

It is seen from FIG. 3 that, by this etching, the yield measured by the GOI starts to increase at about 20 nm and reaches 100% at about 500 nm.

Figure 2C:
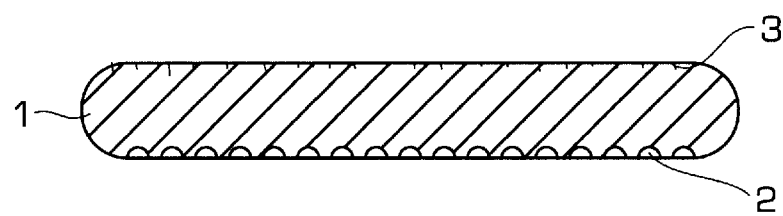
Figure 2D:
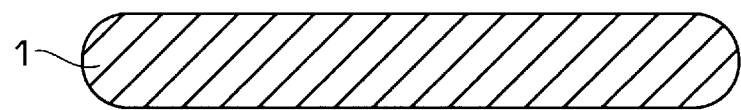

In the finish polishing step, by using a polishing slurry containing grinding grains having a grain size less than 5 nm, because the mechanical action is reduced, a fine grain polishing is proceeded. As shown in FIG. 2(c), the working strains 3 are minimized. However, the smaller the grain size of the grinding grains, the lower the polishing rate.

Moreover, by setting the pH of the slurry in the range of 10–11 to increase the alkali etching capability of the polishing, the polishing rate increases and the working strains occurred in the mechanical polishing are simultaneously removed. Furthermore, by increasing the etching capability, it is possible to increase the polishing rate.

Finally, by washing the finish polished semiconductor wafers with an SC-1 solution, the working strains produced by the finish polishing which are slightly removed on the surface of the semiconductor wafer can be almost completely removed. By doing so, although the GOI is improved, the yield by this measurement varies with the polishing conditions.

That is, by washing the semiconductor wafer obtained by finish polishing with slurry as the prior art with an SC-1 solution, when the washed away thickness of the washing is about 20 nm, a yield of 60% is obtained.

Moreover, when the grain size of the finish polishing grains is less than 5 nm, even though the washed away thickness with the SC-1 solution is about 10 nm, a yield of 70% is obtained.

Moreover, by setting the pH of the slurry in the range of 10–11, even though there is almost no washed away thickness with the SC-1 solution, a yield of 70% is obtained.

Accordingly, when the washed away thickness is less than 20 nm, the effect is sufficient.

Furthermore, although in the above example, an aqueous solution of 1% NaOH was used as the alkali etching solution, it is not limited to this, an SC-1 solution ($NH_4OH/H_2O_2/H_2O$), or an aqueous solution of KOH or amine is also suitable for use.

Moreover, in the above example, although an SC-1 solution was used in the washing after the finish polishing, it is not limited to this, any solution having the same etching capability, for example an aqueous solution of amine and the like can also be used.

The invention is described as above, as the working strains produced by polishing can almost completely removed, the GOI can be improved significantly and thus has an excellent effect.

Moreover, differing from sacrificial oxidation method, a heat treatment is not necessary. The contamination of metal inside the silicon crystal is prevented. The manufacturing steps up through the final products do not become void and both precision and efficiency effects can be obtained.

What is claimed is:

1. A method of manufacturing a semiconductor wafer:
   (a) primary polishing at least one side of the semiconductor wafer;
   (b) etching the product of step a with a weak alkali etching solution to remove a work strain caused by step a;
   (c) mirror processing the side of the product of step b by finish polishing; and
   (d) washing the product of step c with a washing solution having a weak etching capability.

2. The method of manufacturing a semiconductor wafer as claimed in claim 1, wherein said step of washing comprises a step of washing by using an SC-1 solution.

3. The method of manufacturing a semiconductor wafer as claimed in claim 1, wherein the etching amount in said step of etching is less than 1,000 nm.

4. The method of manufacturing a semiconductor wafer as claimed in claim 1, wherein the grain size of the grinding grains in said step of mirror processing is less than 5 nm.

5. The method of manufacturing a semiconductor wafer as claimed in claim 1, wherein the pH of the slurry used in said step of mirror polishing is in the range of 10–11.

6. The process for manufacturing a semiconductor wafer as claimed in claim 1, characterized in that the thickness in the washing step is less than 20 nm.

7. A method of manufacturing a semiconductor wafer, comprising:
   (a) lapping the sliced and chamfered semiconductor wafer;
   (b) etching the lapped semiconductor wafer and removing the working strains produced by lapping in step a;
   (c) primary polishing both sides of an etched semiconductor wafer produced in step b using a two-surface primary polishing machine;
   (d) etching the product of step c with a weak alkali to remove a work strain caused by step c;
   (e) mirror processing the product of step d by finish polishing;
   (f) washing the product of step e.

* * * * *